(12) United States Patent
Rudolph et al.

(10) Patent No.: US 8,570,284 B2
(45) Date of Patent: Oct. 29, 2013

(54) ANNULAR BAR GRAPH AND MULTI-SEGMENT DISPLAY

(75) Inventors: John Rudolph, Antioch, TN (US); William Yao, Pomona, CA (US)

(73) Assignee: Electrolux Home Products, Inc., Charlotte, NC (US)

( * ) Notice: Subject to any disclaimer, the term of this patent is extended or adjusted under 35 U.S.C. 154(b) by 592 days.

(21) Appl. No.: 12/645,968

(22) Filed: Dec. 23, 2009

(65) Prior Publication Data

US 2011/0148775 A1   Jun. 23, 2011

(51) Int. Cl.
*G06F 3/041* (2006.01)

(52) U.S. Cl.
USPC ........................................................ 345/173

(58) Field of Classification Search
USPC ................................................. 345/173–176
See application file for complete search history.

(56) References Cited

U.S. PATENT DOCUMENTS

| | | |
|---|---|---|
| 3,886,539 A | 5/1975 | Gould |
| 4,121,204 A * | 10/1978 | Welch et al. .................. 345/174 |
| 4,158,216 A | 6/1979 | Bigelow |
| 4,242,676 A | 12/1980 | Piguet et al. |
| 4,264,903 A | 4/1981 | Bigelow |
| 6,403,904 B1 | 6/2002 | Schilling |
| 6,603,708 B2 * | 8/2003 | Tamagawa et al. ............. 368/10 |
| 2003/0076306 A1 | 4/2003 | Zadesky et al. |
| 2003/0095096 A1 | 5/2003 | Robbin et al. |
| 2004/0007566 A1 * | 1/2004 | Staebler et al. ............ 219/445.1 |
| 2005/0052429 A1 | 3/2005 | Philipp |
| 2005/0057529 A1 | 3/2005 | Serrano |
| 2006/0036338 A1 * | 2/2006 | Harkcom et al. ................ 700/83 |
| 2007/0046639 A1 * | 3/2007 | Swedin ......................... 345/173 |
| 2008/0094077 A1 | 4/2008 | Philipp |
| 2008/0276192 A1 * | 11/2008 | Jones et al. .................... 715/772 |
| 2009/0009491 A1 | 1/2009 | Grivna |
| 2009/0090605 A1 * | 4/2009 | Arione et al. .................. 200/314 |
| 2009/0115431 A1 | 5/2009 | Philipp |
| 2010/0164871 A1 | 7/2010 | Shigeta et al. |
| 2010/0198425 A1 * | 8/2010 | Donovan ...................... 700/299 |

FOREIGN PATENT DOCUMENTS

| | | |
|---|---|---|
| DE | 19817195 | 9/1999 |
| DE | 102005049802 | 4/2007 |
| DE | 102006001283 | 7/2007 |
| WO | 2008020538 | 2/2008 |

OTHER PUBLICATIONS

International Search Report for PCT/US2010/061985, dated Jun. 8, 2011, 3 pages.

* cited by examiner

*Primary Examiner* — Nicholas Lee

(74) *Attorney, Agent, or Firm* — Pearne & Gordon LLP

(57) ABSTRACT

Provided is a display comprising a first plurality of light-emitting elements forming an annular bar graph, and a numerical display within the annular bar graph. The annular bar graph displays information graphically, and the numerical display simultaneously displays the same information numerically.

5 Claims, 2 Drawing Sheets

ANNULAR BAR GRAPH AND MULTI-SEGMENT DISPLAY

BACKGROUND OF THE INVENTION

1. Field of the Invention

The present invention relates to display devices, and more particularly to illuminated displays that convey information both graphically and through text.

2. Description of Related Art

Display devices can be formed using multiple light-emitting diodes (LEDs). For example, bar graphs can be created by arranging LEDs in a line and selectively activating the LEDs. LEDs can also be used to create letters and/or numbers (i.e., alphanumeric information) by appropriately arranging the LEDs into a multi-segment display (e.g., a seven-segment display).

BRIEF SUMMARY OF THE INVENTION

In accordance with one aspect of the present invention, provided is a display comprising a first plurality of light-emitting elements forming an annular bar graph, and a numerical display within the annular bar graph. The annular bar graph displays information graphically, and the numerical display simultaneously displays the same information numerically.

In accordance with another aspect of the present invention, provided is a packaged display device comprising a first plurality of light-emitting elements forming an annular bar graph, and a second plurality of light-emitting elements forming a multi-segment display within the annular bar graph. The display device includes a common housing for the first plurality of light-emitting elements and the second plurality of light-emitting elements.

In accordance with another aspect of the present invention, provided is a user interface comprising a substrate. An annular touch-sensitive input is located on the substrate. A first plurality of light-emitting elements form an annular bar graph. A numerical display is located within both of the annular touch-sensitive input and the annular bar graph.

DETAILED DESCRIPTION OF THE INVENTION

Figure 1:
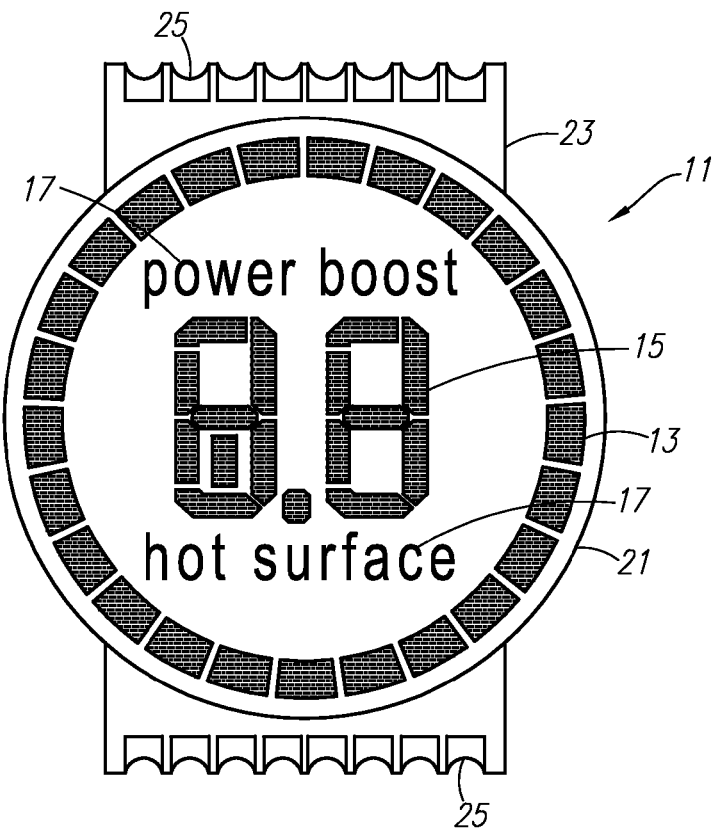
FIG. 1 is a plan view of a display device.

The present invention will now be described with reference to the drawings, wherein like reference numerals are used to refer to like elements throughout. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

FIG. 1 shows a packaged display device 11 for conveying information both graphically and alphanumerically. The display device 11 includes an annular bar graph 13 and a multi-segment display 15 located centrally of (e.g., within) the annular bar graph. The multi-segment display 15 is a numerical display (e.g., capable of displaying numbers and optionally letters and/or characters). In an embodiment, the multi-segment display 15 can display variable alphanumeric information. The display device 11 can also include fixed text elements 17 located centrally of the annular bar graph and adjacent to the multi-segment display, for selectively displaying fixed strings of text.

The annular bar graph 13, multi-segment display 15 and fixed text elements 17 have light-emitting elements 19 (see FIG. 2) associated therewith for creating the displayed information through selective activation of the light-emitting elements 19. Example light-emitting elements include LEDs, vacuum fluorescent displays and liquid crystal displays.

The light-emitting elements 19 are mounted within a common housing 21 to form the packaged display device 11. The light-emitting elements 19 can be mounted within a cylindrical portion of the common housing 21. The common housing 21 can include a printed circuit board 23, for example, for connecting the light-emitting elements to another circuit. The printed circuit board 23 can include a plurality of terminals 25 that are capable of being connected to, e.g., soldered to, a substrate such as another printed circuit board. In an embodiment, the display device is adapted for surface mounting to the substrate. The display device can be further adapted for automated assembly to the substrate using known techniques for automated assembly of printed circuit boards.

Figure 2:
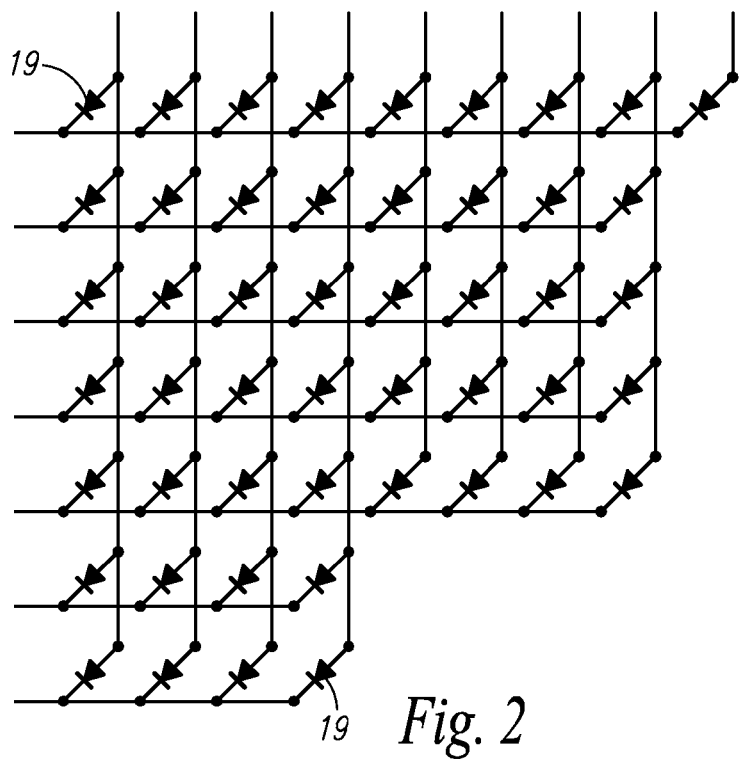
FIG. 2 is a schematic electrical diagram of the display device in FIG. 1.

As shown in FIG. 2, in an embodiment that includes LEDs, the LEDs can be arranged electrically as a matrix of rows and columns. Selected LEDs can be activated by switching the appropriate row and column terminals to form a completed electrical circuit. The row and column terminals correspond to respective terminals 25 on the printed circuit board 23 of the display device 11. In the embodiment shown in FIG. 2, the display device 11 includes forty-nine (49) LEDs allocated among seven (7) rows and nine (9) columns. It is to be appreciated that the display device can include more or fewer than 49 LEDs, which can be allocated to various rows and columns as desired.

The annular bar graph 13 is formed by a plurality of light-emitting elements arranged in a circle. Each light-emitting element forms a small segment of the annular bar graph 13. In an embodiment, each small segment is an arcuate segment. In an embodiment, the annular bar graph 13 comprises twenty-five (25) light-emitting elements. It is to be appreciated that the annular bar graph 13 can include more or fewer than 25 light-emitting elements.

Via selective activation of the light-emitting elements, various display effects can be created using the annular bar graph 13. For example, a single light-emitting element can be activated to provide a small light segment. The small light segment can be made to move clockwise or counterclockwise around the annular bar graph 13 by appropriately activating and deactivating light-emitting elements in sequence. The small light segment can be lengthened in a clockwise and/or counterclockwise direction by activating adjacent light-emitting elements. The lengthened light segment can be made to move around the annular bar graph 13 and can also be contracted or shortened into a smaller light segment. Further, multiple light segments can be displayed and made to move around the annular bar graph 13 or lengthened/shortened simultaneously.

As noted above, the multi-segment display 15 can display variable alphanumeric information. The variable alphanumeric information can be related to information displayed graphically by the annular bar graph 13. For example, a light segment displayed by the annular bar graph 13 can graphically represent a level (e.g., a power level). The same level can simultaneously be displayed as a number on the multi-segment display 15. As the light segment moves or is lengthened/contracted on the annular bar graph 13, the number displayed by the multi-segment display 15 can change correspondingly.

The annular bar graph 13 and multi-segment display 15 can also display different information. For example, the multi-segment display 15 can display a level setting set by a user while the annular bar graph 13 displays a monitored condition, such as a temperature.

As noted above, the display device 11 can include fixed text elements 17 for selectively displaying fixed strings of text within the annular bar graph 13. The fixed text elements 17 are displayed by activating one or more light-emitting elements associated with the text elements 17. In FIG. 1, the example text elements "power boost" and "hot surface" can be displayed by simultaneously activating several light-emitting elements that are respectively associated with one of the text elements. For example, each text element 17 can have four (4) associated light-emitting elements, which are activated simultaneously to display the corresponding text element.

The display device 11 can be associated with an input device to form a user interface. A controller can monitor the input device and display corresponding information using the display device 11. The information can be simultaneously displayed both graphically using the annular bar graph 13 and numerically using the multi-segment display 15. An example input device is a potentiometer or rotary encoder having a control knob. As the control knob is rotated clockwise, for example, a light segment displayed by the annular bar graph 13 can be lengthened while the number displayed on the multi-segment display 15 is increased. As the control knob is subsequently rotated counterclockwise, the light segment can be contracted or shortened while the displayed number is decreased. It is to be appreciated that the light segment can be moved circumferentially around the annular bar graph 13 as the control knob is rotated.

Figure 3:
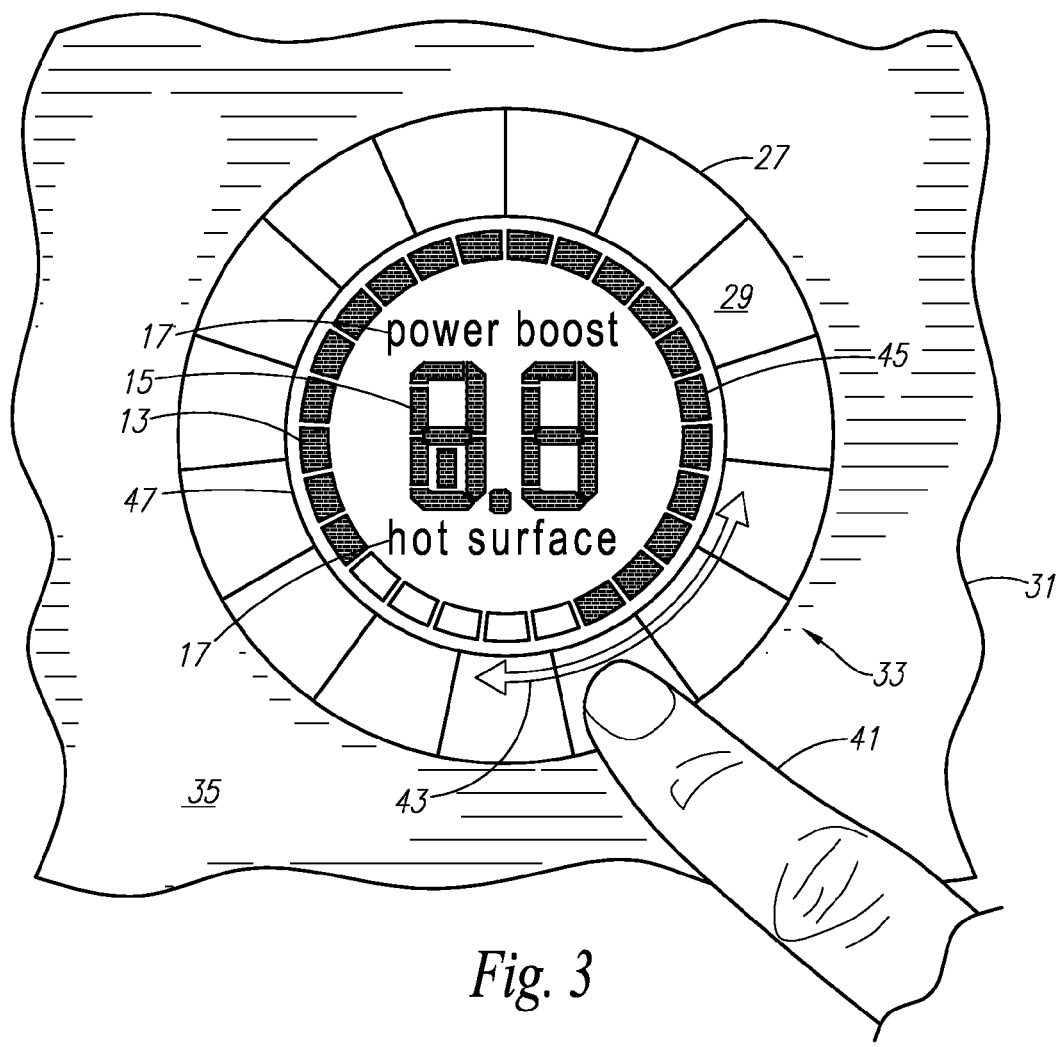
FIG. 3 is a partial plan view of a user interface including the display device of FIG. 1.

Turning to FIG. 3, the user input device associated with the display device can be an annular touch-sensitive input 27. The annular touch-sensitive input 27 includes a plurality of electrodes 29 mounted to a substrate 31, such as a printed circuit board. The electrodes 29 are arranged annularly around the display device. Touch sensor circuitry, which may be part of a controller for the user interface 33, monitors the electrodes 29 for capacitance changes that are indicative of touch events. The controller for the user interface controls operations of the annular bar graph 13 and the multi-segment display 15 in accordance with touch events (e.g., rotational inputs) received through the annular touch-sensitive input 27. An example controller incorporating touch sensor circuitry for use in a user interface is model CY8C24894 from Cypress Semiconductor Corp.

The substrate 31 can include a through-hole 47 or aperture for the display device located centrally of the annular touch-sensitive input 27. The annular touch-sensitive input 27 surrounds the through-hole 47 and the display device. The display device is aligned with the through-hole 47 and mounted to the substrate 31. The annular bar graph 13 is located concentrically within the annular touch-sensitive input 27. The annular touch-sensitive input 27 has an inner circumference at generally the same location as the circumference of the through-hole 47, and the annular bar graph 13 is located entirely within the inner circumference of the annular touch-sensitive input 27. In other embodiments, the annular bar graph 13 can be located outside of the inner circumference of the annular touch-sensitive input 27. For example, the annular bar graph 13 can be located behind the annular touch-sensitive input 27, i.e., between the inner circumference and an outer circumference of the annular touch-sensitive input 27, or completely outside of the annular touch-sensitive input 27.

In an embodiment, the display device has a generally flat, circular upper surface that is mounted flush with an upper surface 35 of the substrate 31 through the through-hole 47, to form a generally smooth, continuous surface of the user interface 33. The terminals 25 of the display device 11 (see FIG. 1) can be soldered to the lower surface (not shown) of the substrate 31 to secure the display device to the substrate.

Figure 4:
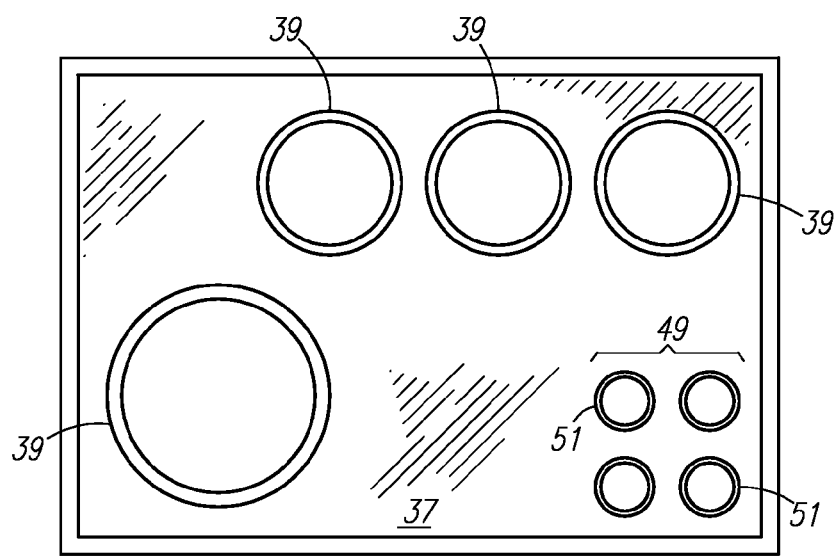
FIG. 4. is a plan view of a cooktop.

The substrate 31 and display device 11 assembly can in turn be mounted to a touch surface substrate that a user touches to activate the annular touch-sensitive input 27. Example touch surface substrates include glass and plastic panels. The touch surface substrate can be part of a control panel for a domestic appliance and the user interface 33 can control operations of the appliance. As shown in FIG. 4, the domestic appliance can be a cooktop 37 having a plurality of heating elements 39 (e.g., electrical resistance or induction heating elements), and the user interface can control operations of the heating elements according to user touches on the cooktop. In FIG. 4, the cooktop 37 is the touch surface substrate and the user interface is attached (e.g., fastened or adhered) to the underside of the cooktop 37. For example, the substrate 31 can be glued to the underside of the cooktop. The substrate 31 can have a plurality (e.g., 2, 3, 4 or more) of annular touch-sensitive inputs 27 and display devices mounted to the substrate. The cooktop 37 has a touch control area 49 in register with the user interface 33, which is mounted directly beneath the touch control area 49. The touch control area 49 includes graphics 51 to inform the user of the location of the annular touch-sensitive inputs.

The touch surface substrate (e.g., the cooktop 37) can be translucent or light-diffusing so that the annular bar graph, multi-segment display and fixed text elements are not visible when their corresponding light-emitting elements are deactivated.

User operation of the annular touch-sensitive input 27 and corresponding operations of the display device 11 are described below in the context of setting a power level for a heating element 39 in a cooktop 37. It is to be appreciated that the disclosed user interface 33 can be applied to other appliances (e.g., dishwashers, washing machines, clothes dryers, refrigerators, freezers, stoves, microwave ovens, etc.) and devices requiring a level or magnitude setting from a user.

Referring to FIG. 3, a user can slide a finger 41 in a circular motion 43 clockwise or counterclockwise along the annular touch-sensitive input 27. Sliding the finger 41 in a first direction, e.g., clockwise, increases the power level setting for the corresponding heating element. Sliding the finger 41 in a second direction, e.g., counterclockwise, decreases the power level setting for the corresponding heating element.

The magnitude of the power level setting is displayed to the user by the annular bar graph 13 and the multi-segment display 15. As the user slides the finger 41 to increase the power level, a rotational light display is generated by the annular bar graph 13. For example, a light segment 45 displayed by the annular bar graph can be made to lengthen as the power level is increased, or a small light segment can be made to move with the finger 41 as power level is increased. As the power level is decreased, the light segment 45 can be made to contract or a small light segment can be made to move with the finger 41.

It is to be appreciated that the annular bar graph 13 imitates an analog gauge and graphically displays information to the user in an analog-type format. While the annular bar graph 13 displays the power level information graphically, the multi-segment display 15 displays the power level information numerically or alphanumerically. For example, the multi-segment display 15 can display a decimal number to indicate the power level (e.g. "7.3"), or text such as "HI" or "LO" to indicate the power level. The display device 11, therefore, can display information both graphically and through text.

An example power-setting operation can include sliding the finger 41 from a 6:00 position on the annular touch-sensitive input 27 to a 12:00 position, to establish a "medium" power level setting. As the finger 41 is moved to the 12:00 position, a light segment can lengthen into a semicircle or move with the finger, and the multi-segment display 15 can display appropriate text (e.g., "5.0"). Subsequently, the finger can be slid from 12:00 position to the 9:00 position to reduce the power level setting. As the finger 41 is moved to the 9:00 position, the light segment can shorten into a quarter circle or move with the finger, and the multi-segment display 15 can display appropriate text (e.g., "2.5").

Rather than sliding the finger 41 along the annular touch-sensitive input 27 to increase or decrease a setting, a user can directly touch portions of the annular touch-sensitive input to change the setting. For example, the finger 41 can be slid from the 6:00 position to the 12:00 position to establish an initial setting. Subsequently, the 3:00 position can be directly touched once, twice etc., to increase the setting to that position, rather than sliding the finger 41 from the 12:00 position to the 3:00 position.

It is to be appreciated that the annular bar graph 13 and the multi-segment display 15 can be provided as separate components, rather than housed in the common housing 21.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A packaged display device, comprising:
   a printed circuit board having a common housing mounted thereon;
   a first plurality of light-emitting elements, forming an annular bar graph, mounted within the common housing on the printed circuit board;
   a second plurality of light-emitting elements, forming a multi-segment display within the annular bar graph, also mounted within the common housing on the printed circuit board; and
   wherein both of the first plurality of light-emitting elements and the second plurality of light-emitting elements are arranged electrically as a matrix between both of a first group of terminals on the printed circuit board and a second group of terminals on the printed circuit board such that a selected light-emitting element of either of the first plurality or second plurality of light-emitting elements is activated through switching a plurality of individual terminals included in the first group and second group of terminals that collectively identify the selected light-emitting element to be activated, and
   wherein the first group of terminals and the second group of terminals are configured for surface mounting the packaged display device to another printed circuit board.

2. The packaged display device according to claim 1, further comprising a third plurality of light-emitting elements that selectively illuminate text, wherein the text is located within the annular bar graph adjacent to the multi-segment display.

3. The packaged display device according to claim 2, wherein the annular bar graph includes a plurality of arcuate segments surrounding the multi-segment display and text.

4. A user interface, comprising:
   a substrate;
   an annular touch-sensitive input located on a first surface of the substrate and surrounding a through-hole in the substrate;
   a packaged display device aligned with the through-hole in the substrate, and mounted to a second surface of the substrate opposite the first surface, the packaged display device comprising:
      a first plurality of light-emitting elements forming an annular bar graph concentrically within the annular touch-sensitive input; and
      a numerical display located within the annular bar graph, the numerical display includes a second plurality of light-emitting elements,
      wherein the packaged display device comprises a common housing for the first plurality of light-emitting elements and the second plurality of light-emitting elements, wherein the first plurality of light-emitting elements and the second plurality of light-emitting elements are located within the common housing, wherein both of the first plurality of light-emitting elements and the second plurality of light-emitting elements are arranged electrically as a matrix between both of a first group of terminals and a second group of terminals, and
      wherein based on a rotational input using the annular touch-sensitive input, a number displayed by the numerical display changes and a corresponding rotational light display is generated by the annular bar graph, the rotational light display including a circumferentially lengthening light segment, such that the annular bar graph displays changing information corresponding to the rotational input graphically and the numerical display simultaneously displays the same changing information numerically within the annular bar graph.

5. The user interface according to claim 4, wherein the first group of terminals and the second group of terminals are located on a printed circuit board forming a part of the common housing of the packaged display device, and wherein the first group of terminals and the second group of terminals surface mount the packaged display device to the second surface of the substrate opposite the first surface.

* * * * *